Figure 1:
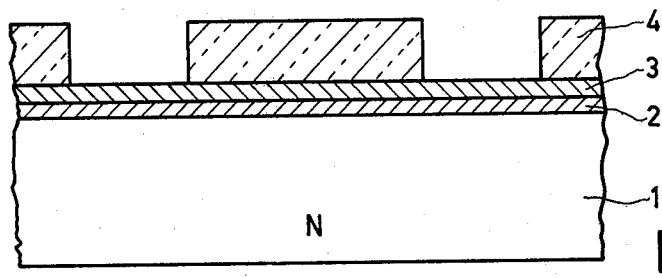

United States Patent [19]

Sanders et al.

[11] 4,374,698
[45] Feb. 22, 1983

[54] METHOD OF MANUFACTURING A SEMICONDUCTOR DEVICE

[75] Inventors: Jozef A. M. Sanders, Sunnyvale, Calif.; Franciscus H. M. Sanders; Hendrikus Kalter, both of Eindhoven, Netherlands; Everhardus P. G. T. van de Ven, Sunnyvale, Calif.

[73] Assignee: U.S. Philips Corporation, New York, N.Y.

[21] Appl. No.: 281,757

[22] Filed: Jul. 9, 1981

[30] Foreign Application Priority Data

Jul. 11, 1980 [NL] Netherlands .......................... 8004005

[51] Int. Cl.³ .......................... B44C 1/22; C03C 15/00; C03C 25/06
[52] U.S. Cl. ..................................... 156/643; 156/646; 156/657; 204/192 E; 252/79.1
[58] Field of Search ............... 156/643, 646, 653, 657, 156/659.1, 662; 204/164, 192 E, 298; 427/38, 39; 252/79.1

[56] References Cited

U.S. PATENT DOCUMENTS 4,174,251 11/1979 Paschke .......................... 156/643
4,226,665 10/1980 Mogab ........................... 156/643

Primary Examiner—William A. Powell
Attorney, Agent, or Firm—Paul R. Miller

[57] ABSTRACT

A method of manufacturing a semiconductor device in which layers of silicon nitride and silicon oxide are etched by bringing the layers into contact with constituents of a plasma which is formed in a gas mixture which contains a fluoride compound and an oxygen compound. By addition of from 1 to 15% by volume of a gaseous compound which contains a halogen other than fluoride to the gas mixture, silicon nitride layers can be etched away at least five times faster than silicon oxide layers. The method is thus suitable in practice, for example, for manufacturing a silicon nitride mask for the formation of a field oxide in LOCOS processes.

11 Claims, 6 Drawing Figures

METHOD OF MANUFACTURING A SEMICONDUCTOR DEVICE

The invention relates to a method of manufacturing a semiconductor device where a layer of silicon nitride which is present on a substrate is etched by bringing the layer into contact with constituents of a plasma which is formed in a gas mixture which contains a fluorine compound and an oxygen compound. The layer of silicon nitride can be brought into contact solely with electrically uncharged constituents of the plasma, like in customary tunnel reactors, but alternatively with a mixture of electrically charged and non-charged constituents of the plasma, like in customary planar reactors.

A method of this kind is particularly suitable, for example, for manufacturing a semiconductor device whose starting material is an Si substrate comprising an $SiO_2$ layer on which an $Si_3N_4$ layer is present, the $Si_3N_4$ being locally removed from the $SiO_2$ layer by etching. The $Si_3N_4$ mask thus formed can be used as an oxidation mask as well as an ion implantation mask. During the manufacture of the $Si_3N_4$ mask, the $SiO_2$ layer serves to prevent damaging of the Si substrate which is situated therebeneath and which is liable to be strongly attacked by the constituents of the plasma. Therefore, the thickness of the $SiO_2$ layer should be chosen so that adequate protection of the substrate is achieved. This thickness is determined in practice inter alia by the ratio of the rates at which $Si_3N_4$ and $SiO_2$ can be etched away. As $Si_3N_4$ can be etched away faster than $SiO_2$, the $SiO_2$ layer may be chosen to be thinner.

A method of the described kind is known from the U.S. Pat. No. 3,795,557 where the silicon nitride layer is etched by bringing the layer into contact with a mixture of electrically charged and non-charged constituents of a plasma which is formed in a gas mixture which contains $CF_4$ as the fluoride compound and 8.5% by volume of $O_2$ as the oxygen compound. Using this known method, $Si_3N_4$ can be etched away approximately twice as fast as $SiO_2$.

It is a drawback of the described method that $Si_3N_4$ can be etched away only slightly faster than $SiO_2$. Therefore, when this method is used in cases where a mask is etched in an $Si_3N_4$ layer on an Si substrate with a protective $SiO_2$ layer, the $SiO_2$ layer has to be comparatively thick. This makes the known method unsuitable in practice, for example, for manufacturing an $Si_3N_4$ oxidation mask for the deposition of field oxide in LOCOS processes.

It is one of the objects of the invention to mitigate this drawback. To this end, a method of the described kind in accordance with the invention is characterized in that from 1 to 15% by volume of a gaseous compound which contains a halogen other than fluoride is added to the gas mixture. By addition of a small amount of a compound containing a halogen other than fluoride, $Si_3N_4$ can be etched away at least five times faster than $SiO_2$. Therefore, in cases where the method in accordance with the invention is used for etching a mask in an $Si_3N_4$ layer which is present on an Si substrate with a protective $SiO_2$ layer, the $SiO_2$ layer may be comparatively thin. This renders the method in accordance with the invention suitable in practice, for example, for manufacturing an $Si_3N_4$ oxidation mask for the deposition of field oxide in LOCOS processes. Presumably, the halogen other than fluoride is selectively absorbed on the $SiO_2$ surface where it forms a protective layer against reactive constituents formed in the plasma.

According to a preferred embodiment of the method in accordance with the invention, the gas mixture in which the plasma is formed contains $CF_4$ as the fluoride compound and the non-corrosive and non-poisonous gas $CF_2Cl_2$ is added thereto. When from 1 to 4% by volume thereof are added to the gas mixture, the largest difference in etching rate of $Si_3N_4$ and $SiO_2$ occurs, notably if an oxygen compound of from 3 to 10% by volume of $O_2$ is added. $Si_3N_4$ is then removed approximately five times faster than $SiO_2$.

According to a further preferred embodiment of the method in accordance with the invention, the gas mixture in which the plasma is formed contains $CF_4$ as the fluoride compound and the non-corrosive and non-poisonous $CF_3Br$ is added thereto. When from 2 to 8% by volume thereof are added to the gas mixture, the largest difference in the etching rate of $Si_3N_4$ and $SiO_2$ occurs, notably if from 3 to 10% by volume of $O_2$ are added as the oxygen compound. $Si_3N_4$ is then removed approximately ten times faster than $SiO_2$.

If the gas mixture in which the etching plasma is formed contains $CF_4$ as the fluoride compound, from 20 to 40% by volume of NO as the oxygen compound, and from 1 to 3% by volume of $CF_3Br$, $Si_3N_4$ is removed approximately twelve times faster than $SiO_2$.

Figure 3:
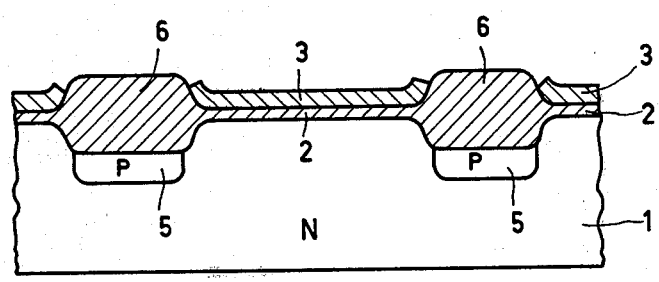
Figure 4:
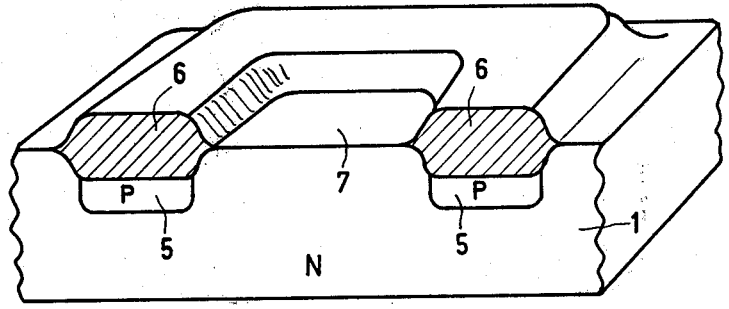
Figure 5:
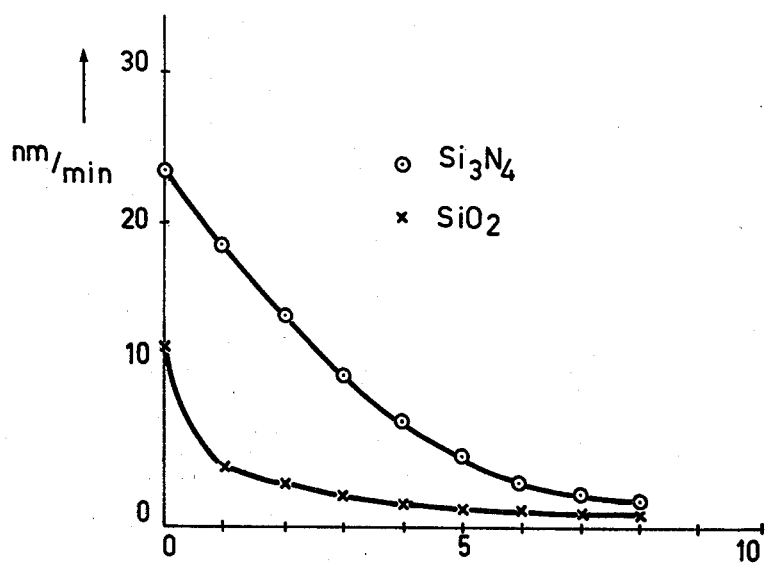
Figure 6:
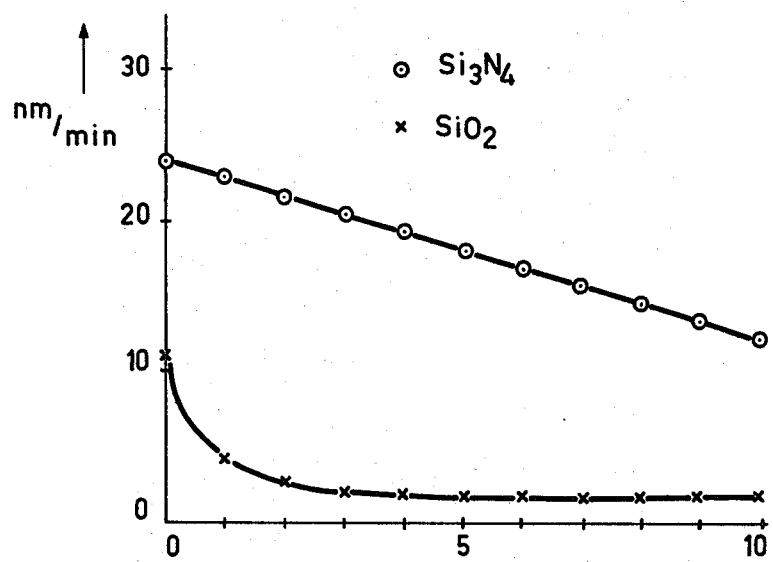

The invention will be described in detail hereinafter, by way of example, with reference to the drawing and some embodiments. In the drawing:

FIGS. 1 to 4 diagrammatically show successive stages of manufacture of a semiconductor device, using the method in accordance with the invention, and FIGS. 5 and 6 show rates at which $Si_3N_4$ and $SiO_2$ layers present on an Si substrate are etched away by means of constituents of plasmas formed in $CF_4/O_2$ mixtures where variable quantities of $CF_2Cl$ and $CF_3Br$, respectively, have been added.

FIGS. 1 to 4 diagrammatically show successive stages of manufacture of a field oxide pattern for which a basic material is used in the form of an N-type Si substrate 1 which comprises an $SiO_2$ layer 2 having a thickness of from 20 to 100 nm and on which an $Si_3N_4$ layer 3 having a thickness of from 100 to 150 nm is present. The $Si_3N_4$ layer 3 is locally covered with a lacquer layer 4 in a customary manner, after which the non-covered locations are etched by bringing these locations into contact with constituents of a plasma which is formed in a gas mixture which contains a fluoride compound and an oxygen compound. In accordance with the invention, from 1 to 15% by volume of a gaseous compound containing an halogen other than fluoride is added to the gas mixture. As a result, $Si_3N_4$ can be etched away at least five times faster than $SiO_2$, so that the protective $SiO_2$ layer 2 may be comparatively thin. This method is thus suitable for manufacturing a mask for the deposition of field oxide in the $Si_3N_4$ layer 3 in practice.

Figure 2:
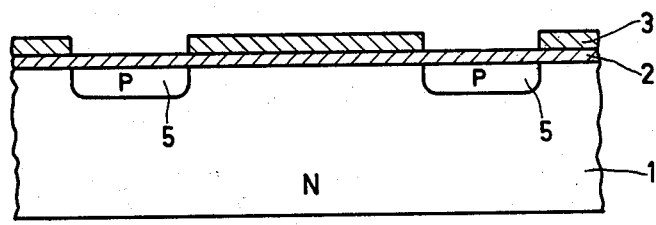

After local removal of the $Si_3N_4$ layer 3 and after the lacquer layer 4 has also been removed, P-type regions 5 which can serve as "channel stopper" between different circuit components can be formed by means of a customary B-implantation. The mask formed in the $Si_3N_4$ layer 3 then serves as an implantation mask (FIG. 2). Subsequently, $SiO_2$ regions 6 having a thickness of approximately 1000 nm are formed in a customary manner by oxidation (FIG. 3). These $SiO_3$ regions 6, also referred to as field oxide regions serve, in conjunction with the P-type Si regions 5 situated therebelow, for the separation of different circuit elements to be formed on the Si substrate 1. During the formation of the field oxide regions 6, the mask formed in the $Si_3N_4$ layer 3 serves as an oxidation mask. Finally, the remaining parts of the $Si_3N_4$ layer 3 and the $SiO_2$ layer 2 are removed in a customary manner (FIG. 4). Circuit elements such as field effect transistors can then be provided on the resultant parts 7 of the Si substrate 1 which are enclosed by field oxide regions 6; for the sake of clarity, only one of these parts 7 is shown, but very many of these parts may be present on the substrate.

For the embodiments to be described hereinafter, Si discs having a diameter of approximately 75 mm and covered with approximately 500 nm of $Si_3N_4$ on an intermediate layer of approximately 400 nm of $SiO_2$ were brought into contact, at a substrate temperature of approximately 125° C., with non-charged constituents of a plasma generated in a plasma etching reactor at a frequency of 13,56 MHz, a power of approximately 150 W, and a gas flow rate of from 100 to 300 SCC/min.

EXAMPLE I

FIG. 5 shows the rates at which $Si_3N_4$ and $SiO_2$ are etched away by the constituents of a plasma formed in a gas mixture with a total pressure of approximately 100 Pa, consisting of $CF_4$ and 5% by volume of $O_2$ as a function of the quantities of $CF_2Cl_2$ added to this gas mixture. Without addition of $CF_2Cl_2$, $Si_3N_4$ is etched away approximately twice as fast as $SiO_2$; when a small quantity of $CF_2Cl_2$ is added (from 1 to 4% by volume), this ratio is approximately five. When larger quantities (>5% by volume) of $CF_2Cl_2$ are added, the ratio decreases again while, moreover, the etching rates of $Si_3N_4$ decrease to low values. Comparable results are to be expected if instead of $CF_2Cl_2$, other Cl compounds are added to the mixture of $CF_4$ and $O_2$, for example, $Cl_2$, $CCl_4$, $CFCl_3$, HCl, etc. However, $CF_2Cl_2$ is to be preferred in view of its ease of handling and low corrosivity.

EXAMPLE II

FIG. 6 shows the rates at which $Si_3N_4$ and $SiO_2$ are etched away by the constituents of a plasma formed in a gas mixture with a total pressure of approximately 65 Pa, consisting of $CF_4$ and 5% by volume of $O_2$ as a function of the quantities of $CF_3Br$ added to this gas mixture. Without addition of $CF_3Br$, $Si_3N_4$ is etched away approximately twice as fast as $SiO_2$; when a small quantity of $CF_3Br$ (from 2 to 8% by volume) is added, this ratio is approximately ten. When larger quantities of $CF_3Br$ are added (>10% by volume), the ratio of the etching rates again decreases while, moreover, the etching rates of $Si_3N_4$ decrease to low values. Comparable results are to be expected if instead of $CF_3Br$ other Br compounds are added to the mixture of $CF_4$ and $O_2$, such as $CF_2Br_2$, HBr, $Br_2$, $BrF_3$, $BrF_5$, etc.; however, $CF_3Br$ is to be preferred in view of its ease of handling, low corrosivity and the fact that it is non-poisonous.

EXAMPLE III

With respect of the example II, a further improvement can be achieved by adding NO as the oxygen compound to the gas mixture in which the plasma is formed instead of $O_2$. In constituents of a plasma formed in a gas mixture with 30% by volume of NO, 7.5% by volume of $CF_3Br$ and 62.5% by volume of $CF_4$, $Si_3N_4$ is etched away twelve times faster than $SiO_2$.

What is claimed is:

1. A method of manufacturing a semiconductor device comprising etching a layer of silicon nitride which is present on a substrate by bringing the layer into contact with constituents of a plasma formed in a gas mixture which contains a fluoride compound and an oxygen compound, characterized in that from 1 to 15% by volume of a gaseous compound which contains a halogen other than fluoride is added to the gas mixture.

2. A method as claimed in claim 1, characterized in that the gas mixture in which the plasma is formed contains $CF_4$ as the fluoride compound and $CF_2Cl_2$ as the compound containing a halogen other than fluoride.

3. A method as claimed in claim 1 or 2, characterized in that the gas mixture in which the plasma is formed contains from 1 to 4% by volume of $CF_2Cl_2$.

4. A method as claimed in claim 1, characterized in that the gas mixture in which the plasma is formed contains $CF_4$ as the fluoride compound and $CF_3Br$ as the compound containing a halogen other than fluoride.

5. A method as claimed in claim 1 or 4, characterized in that the gas mixture in which the etching plasma is formed contains from 2 to 8% by volume of $CF_3Br$.

6. A method as claimed in one of claims 1, 2 or 4 characterized in that the gas mixture in which the plasma is formed contains from 3 to 10% by volume of $O_2$ as the oxygen compound.

7. A method as claimed in one of claims 1, 2 or 4, characterized in that the gas mixture in which the plasma is formed contains from 20 to 40% by volume of NO as the oxygen compound.

8. A method as claimed in claim 3, characterized in that the gas mixture in which the plasma is formed contains from 3 to 10% by volume of $O_2$ as the oxygen compound.

9. A method as claimed in claim 5, characterized in that the gas mixture in which the plasma is formed contains from 3 to 10% by volume of $O_2$ as the oxygen compound.

10. A method as claimed in claim 3, characterized in that the gas mixture in which the plasma is formed contains from 20 to 40% by volume of NO as the oxygen compound.

11. A method as claimed in claim 5, characterized in that the gas mixture in which the plasma is formed contains from 20 to 40% by volume of NO as the oxygen compound.

* * * * *